(12) United States Patent
Hofmann et al.

(10) Patent No.: US 7,560,351 B2
(45) Date of Patent: Jul. 14, 2009

(54) INTEGRATED CIRCUIT ARRANGEMENT WITH LOW-RESISTANCE CONTACTS AND METHOD FOR PRODUCTION THEREOF

(75) Inventors: Franz Hofmann, München (DE); Richard Johannes Luyken, München (DE); Wolfgang Roesner, Ottobrunn (DE); Michael Specht, München (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/324,803

(22) Filed: Jan. 3, 2006

(65) Prior Publication Data

US 2006/0175666 A1 Aug. 10, 2006

Related U.S. Application Data

(63) Continuation of application No. PCT/EP2004/051004, filed on Jun. 2, 2004.

(30) Foreign Application Priority Data

Jul. 8, 2003 (DE) .................. 103 30 730

(51) Int. Cl.
*H01L 21/336* (2006.01)
(52) U.S. Cl. .............. 438/300; 438/255; 438/398; 438/964; 257/309; 257/48; 257/384
(58) Field of Classification Search ........ 257/382, 257/357, 358, 360, 363, 384
See application file for complete search history.

(56) References Cited

U.S. PATENT DOCUMENTS 4,329,705 A * 5/1982 Baker .................. 257/330

| | | | |
|---|---|---|---|
| 4,431,858 A * | 2/1984 | Gonzalez et al. ............ 136/258 |
| 4,520,554 A | 6/1985 | Fisher |
| 4,577,392 A * | 3/1986 | Peterson ..................... 438/303 |
| 4,885,259 A * | 12/1989 | Osinski et al. .............. 438/303 |
| 4,984,039 A * | 1/1991 | Douglas ..................... 257/301 |
| 5,068,199 A | 11/1991 | Sandhu |
| 5,081,062 A * | 1/1992 | Vasudev et al. ............. 438/412 |
| 5,118,383 A * | 6/1992 | Engelhardt ................. 438/700 |
| 5,268,587 A * | 12/1993 | Murata et al. ............... 257/357 |
| 5,394,012 A | 2/1995 | Kimura |

(Continued)

FOREIGN PATENT DOCUMENTS

DE 29 29 939.6 A1 3/1981

(Continued)

OTHER PUBLICATIONS

Quirk, Michael and Julian Serda. "Semiconductor Manufacturing Technology." New Jersey: Prentice Hall, Inc., 2001. pp. 216,261, 309-311.*

(Continued)

*Primary Examiner*—Minh-Loan T Tran
*Assistant Examiner*—Fei Fei Yeung Lopez
(74) *Attorney, Agent, or Firm*—Brinks Hofer Gilson & Lione

(57) ABSTRACT

An integrated circuit arrangement and fabrication method is presented. The integrated circuit arrangement contains a semiconductor and a metal electrode. The contact area between a semiconductor and the electrode is increased without increasing the lateral dimensions using partial regions of the semiconductor and/or of the electrode that extend through a transition layer between the semiconductor and electrode.

17 Claims, 3 Drawing Sheets

U.S. PATENT DOCUMENTS

| | | | |
|---|---|---|---|
| 5,409,861 A | | 4/1995 | Choi |
| 5,474,949 A | | 12/1995 | Hirao et al. |
| 5,512,497 A | * | 4/1996 | Ikeda et al. ............... 438/233 |
| 5,670,426 A | | 9/1997 | Kuo et al. |
| 5,915,197 A | | 6/1999 | Yamanaka et al. |
| 6,057,555 A | * | 5/2000 | Reedy et al. .................. 257/9 |
| 6,388,284 B2 | * | 5/2002 | Rhodes et al. ............. 257/309 |
| 6,544,888 B2 | | 4/2003 | Lee |
| 6,699,745 B1 | * | 3/2004 | Banerjee et al. ........... 438/238 |

FOREIGN PATENT DOCUMENTS

DE 101 35 580 C1 6/2003

OTHER PUBLICATIONS

German Office Action from corresponding German Application No. 103 30 730.3.

International Preliminary Examination Report from corresponding International Application No. PCT/EP2004/051004.

International Search Report from corresponding International Application No. PCT/EP2004/051004.

* cited by examiner

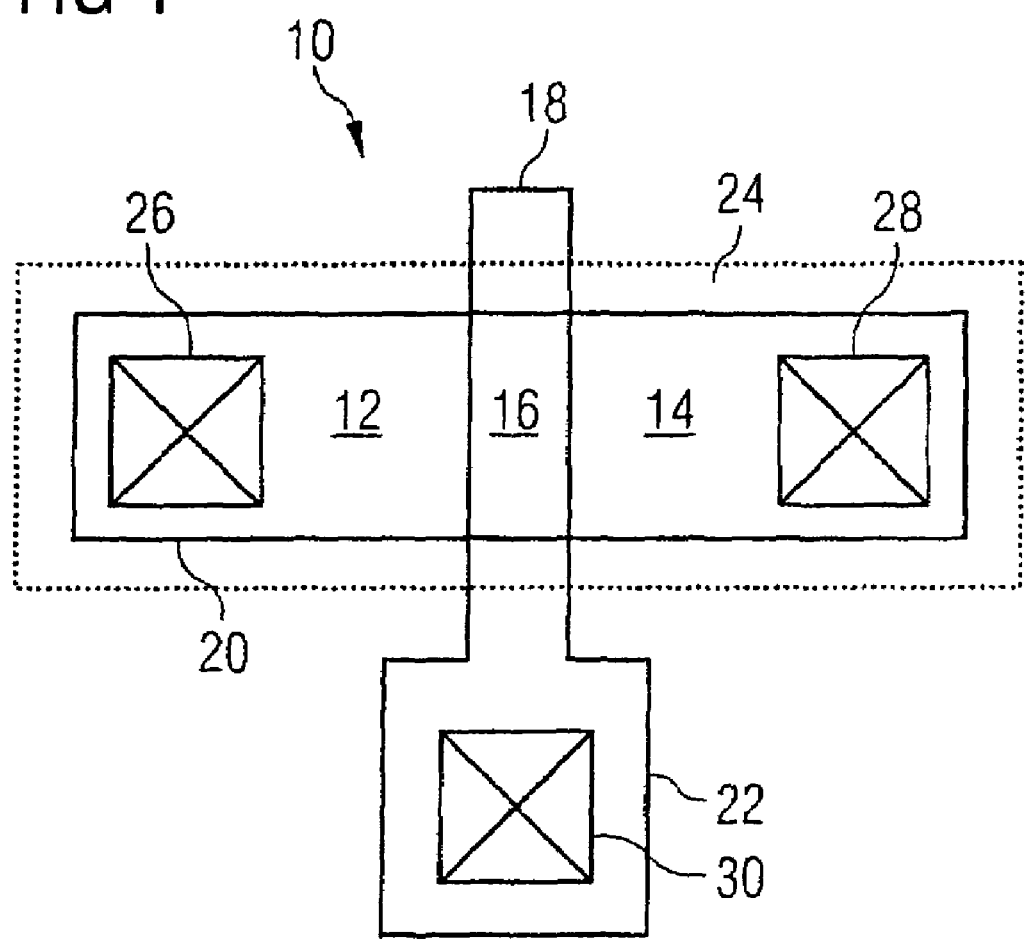

INTEGRATED CIRCUIT ARRANGEMENT WITH LOW-RESISTANCE CONTACTS AND METHOD FOR PRODUCTION THEREOF

PRIORITY CLAIM

This application is a continuation of international application PCT/EP2004/051004, filed on Jun. 2, 2004, which claims priority to German Patent Application DE 103 30 730.3, filed on Jul. 8, 2003, both of which are incorporated by reference in their entirety.

TECHNICAL FIELD OF THE INVENTION

The present invention relates to an integrated circuit arrangement. More particularly, the present invention relates to an integrated circuit arrangement having semiconductor/conductor having an increased contact area between the semiconductor and the conductor.

BACKGROUND OF THE INVENTION

With increasing miniaturization of the components in integrated circuits, the resistance associated with the current crossing from a metallically conductive zone into highly doped semiconductor material, that is to say the ohmic contact resistance, makes up an ever greater proportion of the total resistance of an electrically conductive connection. Many of these integrated circuits use thin film transistors, such as metal-oxide-semiconductor field effect transistors (MOSFETs). The MOSFETs contain a semiconductor, at least some of whose regions are doped, a gate electrode separated from a channel region of the semiconductor by a gate oxide, and electrodes that make ohmic contact with source and drain regions of the semiconductor.

If all the dimensions in the integrated circuit arrangement are decreased linearly, the dopant concentrations being adapted in a suitable manner, then the ratio of the width to the length of the transistor remains the same. Decreasing the dimensions also leads to decreasing the gate oxide thickness. By virtue of the decreased gate oxide thickness, the resistance of the transistor when on (the on resistance) decreases. The ohmic contact, on the other hand, is characterized by a sheet resistivity dependent on the conductor material of the electrodes and the dopant concentration in the semiconductor. Acceptable values of ohmic contact resistance lie for example in the range of $10^{-7}$ to $10^{-6}$ $\Omega cm^2$ (ohm times square centimeter) or 10 to 100 $\Omega\mu m^2$. A contact resistance of 10 to 100$\Omega$ would thus require an area of 1 $\mu m^2$. If the dimensions are decreased, however, the contact resistance increases quadratically with the linear scaling factor. Accordingly, it is difficult to decrease the size of the integrated circuit arrangement without substantially increasing the contact resistance between the source/drain electrodes and the semiconductor.

BRIEF DESCRIPTION OF THE DRAWINGS

The present invention is illustrated by way of example and not limited to the accompanying figures in which like references indicate similar elements. Exemplary embodiments will be explained in the following text with reference to the attached drawings, in which:

FIG. 1 shows geometrical designs or layouts for masks for producing a MOS transistor.

Figure 2A:
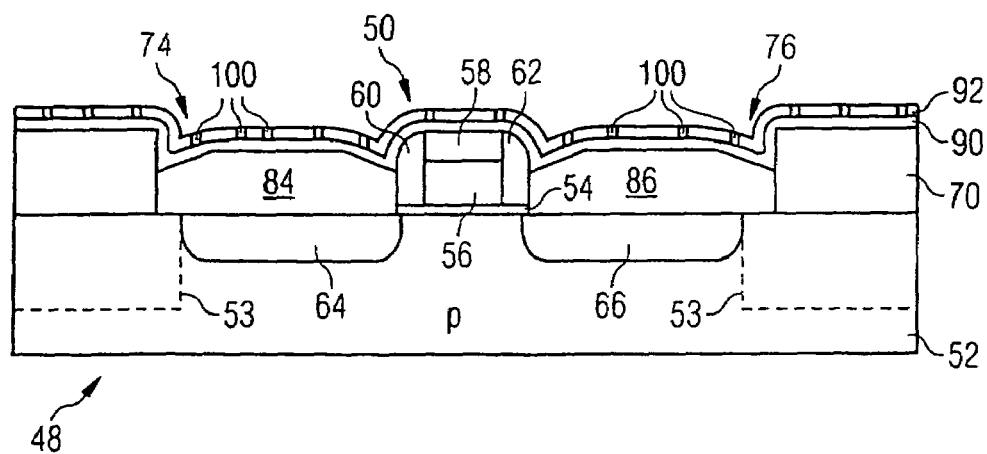
FIGS. 2A and 2B show production stages of a transistor in accordance with a method with self-assembled patterning.

Skilled artisans appreciate that elements in the figures are illustrated for simplicity and clarity and have not necessarily been drawn to scale.

DETAILED DESCRIPTION OF THE INVENTION

An integrated circuit arrangement and fabrication method is presented in which the contact area between a semiconductor and electrode is increased without increasing the lateral dimensions. An electrically insulating insulation layer is situated on a substrate, perhaps with an intermediate layer disposed therebetween. A cutout in the insulation layer exposes the substrate. A connection region containing a metal is arranged in the cutout. A material layer such as a semiconductor is arranged in the cutout between the substrate and the connection region. A transition layer that lies parallel to the surface of the substrate is penetrated by partial regions of the semiconductor and/or of the connection region. The partial regions of the semiconductor are completely surrounded by the connection region in the transition layer or the partial regions of the connection region are completely surrounded by semiconductor in the transition layer. In the transition layer, separate partial regions of the semiconductor may be surrounded by a contiguous partial region of the connection region. Alternatively, in the transition layer separate partial regions of the connection region may be surrounded by a contiguous partial region of the material layer. The interface between the metallic connection region and the semiconductor is increased in a targeted manner by means of surface enlargement methods. In addition, the multiple penetration of the transition layer and the formation of meshed regions with pointed corners or pointed edges give rise to voltage spikes that reduce the contact resistance, for example by enabling tunneling currents.

Deposition methods may be used that produce semiconductor material with a nonplanar surface, such as hemispherical grain (HSG) polycrystalline silicon. In addition, removal of partial regions from already existing semiconductor material may be used to produce a nonplanar surface. For example, pores or trenches can be etched with a mask produced in self-assembled fashion.

Referring to FIG. 1, geometrical designs for a transistor 10 and regions in a substrate are shown. The substrate may contain an inorganic semiconductor material such as silicon. The substrate contains an n-doped source zone 12 and an n-doped drain zone 14. In the substrate, a p-doped channel forming region 16 lies between the source zone 12 and the drain zone 14. The channel forming region 16 is covered by a gate region 18. An insulation mask 20 is used for producing the source region 12 and the drain region 14. The insulation mask 20 is used to define boundaries of insulation zones around the transistor 10, that is to say by means of an elongated rectangular zone in the exemplary embodiment. In other embodiments, other insulation zone shapes may be used.

The position of the gate region 18 and the channel forming region 16 is defined by a gate mask 22. The gate mask 22 contains a rectangle that is narrow in comparison with the rectangle of the insulation mask 20 and is arranged transversely with respect to the rectangle of the insulation mask 20. One end of the narrow rectangle is adjoined by a wider square compared with the short side of the narrow rectangle, in order to define a contact region for a gate contact.

An auxiliary mask 24 defines the position of cutouts for connection regions. The auxiliary mask 24 is explained hereinbelow with reference to FIGS. 2A and 2B,and FIGS. 3A and 3B. The auxiliary mask 24 defines a rectangular zone around the source region 12 and the drain region 14. The rectangular zone of the auxiliary mask 24 is somewhat larger than the rectangular zone of the insulation mask 20. The rectangular zone of the auxiliary mask 24 and the rectangular zone of the insulation mask 20 are centered with respect to one another.

A contact mask defines the position of a source contact 26 at the left-hand end of the source region 12, the position of a drain contact 28 at the right-hand edge of the drain region 14 and the position of a gate contact 30 at the end of the gate region 18.

Figure 2B:
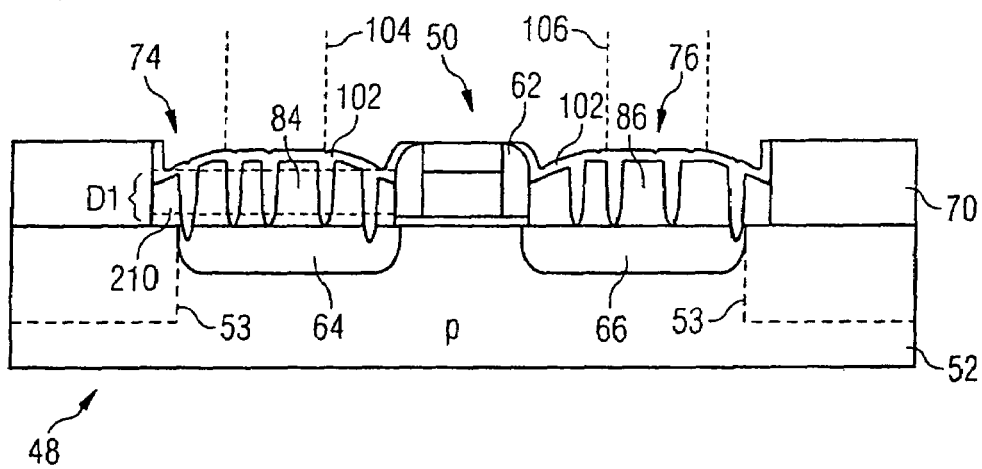

FIGS. 2A and 2B show, for an integrated circuit arrangement 48, production stages of a transistor 50 using a method with self-assembled patterning. Proceeding from a p-doped silicon substrate 52, insulation regions 53 with the insulation mask 20, a gate oxide layer for producing a gate oxide region 54, a highly doped polycrystalline layer for producing a gate region 56 and a protective layer, e.g. a silicon nitride layer, for producing a protective region 58 above the gate region 56 are deposited one after another. The gate region 56 and the protective region 58 are subsequently patterned in a photolithographic method with the aid of the gate mask 22. Electrically insulating spacer elements or spacers 60, 62, e.g. made of silicon nitride or silicon dioxide, are then produced on the sides of the gate region 56 and of the protective region 58.

Next, an n-doped source region 64 and an n-doped drain region 66 are produced with the aid of the insulation mask 20 in self-aligning fashion with respect to the spacer elements 60, 62 and with respect to the gate region 56. An electrically insulating insulation layer 70 is subsequently deposited. The insulating insulation layer 70 may contain an oxide layer and have a thickness of about 200 nm, for example. If the insulation layer 70 contains an oxide layer such as a silicon dioxide layer, the oxide layer may be deposited by means of a TEOS method (tetraethyl orthosilicate), for example. The insulation layer 70 is subsequently planarized using a CMP method (chemical mechanical polishing), for example.

In a subsequent method step, two cutouts 74 and 76 are opened in the insulation layer 70 above the source region 64 and above the drain region 66 respectively, in a photolithographic method using the auxiliary mask 24. This is done in self-aligning fashion with respect to the gate region 56 surrounded by the spacer elements 60, 62 and by the protective region 58.

Subsequently, using a selective epitaxy, an epitaxial region 84 is produced on the source region 64 and an epitaxial region 86 is produced on the drain region 66. The epitaxial regions 84, 86 may contain silicon and/or other semiconductors and may contain the same or different semiconductors. The epitaxial regions 84, 86 may, for example, have a thickness of about 150 nm. The epitaxial regions 84, 86 are doped as highly as possible. Doping of the epitaxial regions 84, 86 can occur in-situ (during the deposition process) and/or by means of a subsequent implantation after the epitaxy.

Pores are then produced in the epitaxial regions 84 and 86. The pores may be produce using, for example, a sublithographic self-assembled mask or electron beam lithography. To produce the sublithographic self-assembled mask for the pores, a thin TEOS layer 90 is deposited, a thin polycrystalline silicon layer 92 is deposited on the TEOS layer 90, the polycrystalline layer 92 is wet-chemical etched so that holes 100 having triangular, rhomboidal or polygonal cross sections arise in the region of the grain boundaries at which three or more grains adjoin one another. The holes accordingly have acute-angled edges with angles between the side faces within a hole of less than 90°. The TEOS layer 90 is then dry etched using the residues of the polycrystalline layer 92 as a mask. The holes 100 thus extend into the TEOS layer 90. The holes 100 are further dry etched to extend into the epitaxial regions 84, 86 using the TEOS layer 90 as a mask. The TEOS layer 90 and polycrystalline silicon layer 92 have thicknesses of about 20 nm and 30 nm, for example.

As illustrated in FIG. 2B, the residues of the polycrystalline layer 92 and of the TEOS layer 90 are then removed. A silicide layer 102 is then deposited directly from the vapor phase for example using a CVD method (chemical vapor deposition). The silicide layer accordingly also fills the holes 100 that extend into the epitaxial regions 84, 86. The holes 100 reach as far as the substrate 52 and in some instances even penetrate into the substrate 52.

The silicide layer 102 is subsequently removed outside the cutouts 74, 76, for example using CMP. A BEOL process (back end of line) is then carried out, during which metallizations are produced. In particular, a source contact 104 and a drain contact 106 may be produced.

In other embodiments, other materials, for example silicon nitride, may be used instead of the TEOS layer 90. In another embodiment, the polycrystalline layer 92 is etched wet-chemically so as to give rise to holes 100 that are interconnected and annular in the region of the grain boundaries. The trenches then extend into the TEOS layer 90 and into the epitaxial regions 84, 86. Alternatively, a nonselective epitaxy process, e.g. CVD, may be used to form monocrystalline epitaxial regions 84, 86. By contrast, polycrystalline regions arise outside the cutouts 74 and 76 and are subsequently removed by e.g. CMP.

Figure 3A:
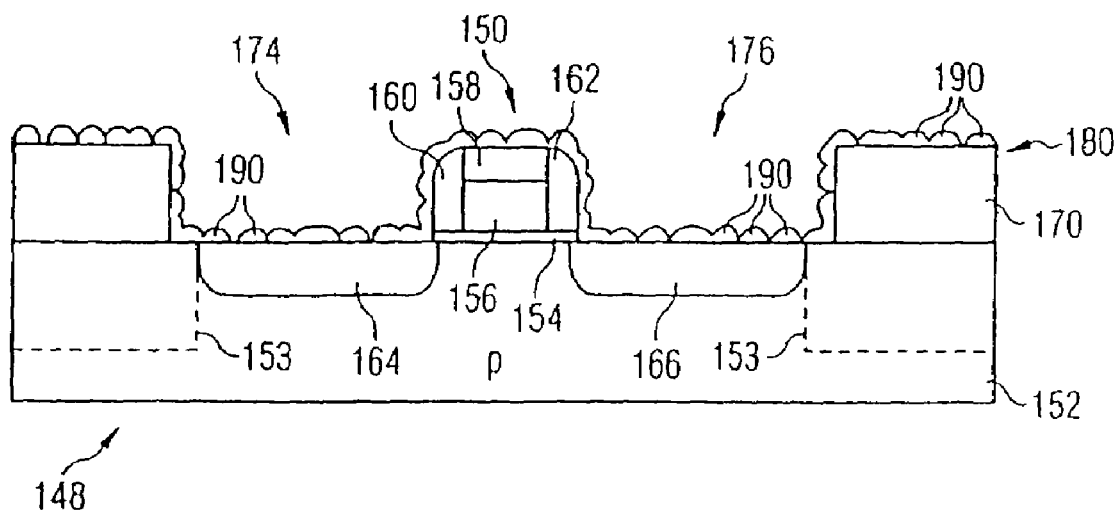
FIGS. 3A and 3B show production stages of a transistor in accordance with an HSG method (hemispherical grain growth).
Figure 3B:
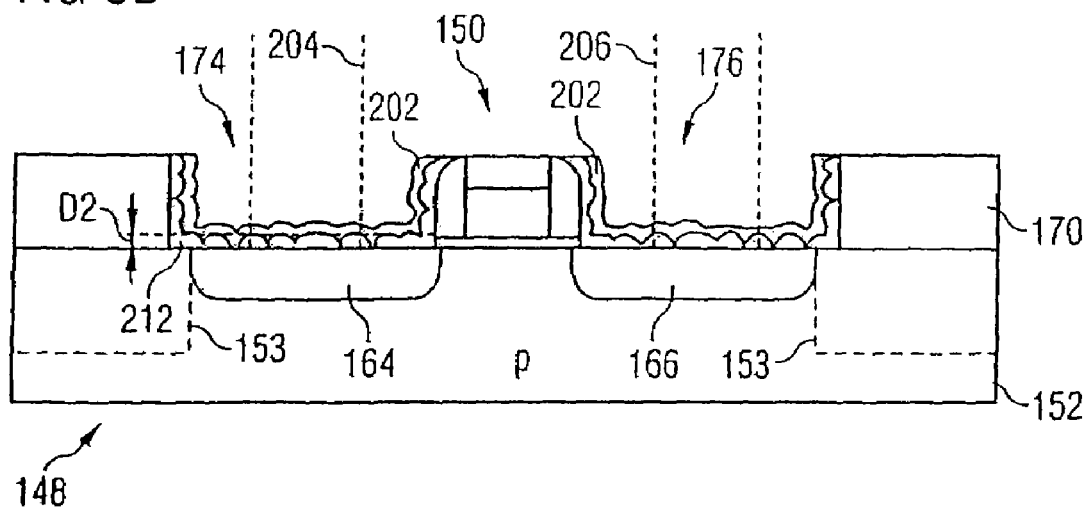

A method for the production of a transistor 150 is explained below for an integrated circuit arrangement 148 with reference to FIGS. 3A and 3B. In this method, the transistor is initially produced similar to the transistor 50. More specifically, insulation regions 153, a gate oxide region 154, a gate region 156, a protective region 158 and spacer elements 160 and 162 are produced in and on a p-doped silicon substrate 152.

A source region 164 and a drain region 166 are additionally produced using the insulation mask 20. A TEOS layer 170 is subsequently deposited and planarized using CMP. With the auxiliary mask 24, the local positions of the cutouts 174 and 176 above the source region 164 and the drain region 166, respectively, are then defined in self-aligning fashion with respect to the gate region 156 and with respect to the spacer elements 160 and 162. The cutouts 174 and 176 are then produced in an etching process.

A monolayer layer 180 made of silicon grains 190 is subsequently produced using a hemispherical grain (HSG) growth method. At least half of the grain surface of each silicon grain 190 is uncovered. Gaps that expose the substrate 152 are also present between adjacent silicon grains 190. The silicon grains 190 are doped as highly as possible in situ.

A silicide layer 202 is subsequently deposited directly from the vapor phase using CVD. A silicon-containing gas, e.g. silane $SiH_4$ and/or $SiH_2Cl_2$, is used, for example. In connection with the CVD deposition of silicide layers, reference is made e.g. to the technical article "Selective deposition of $TiSi_2$ on ultra-thin silicon-on-insulator (SOI) wafers" Jer-Shen Maa et al., Thin Solid Films 332 (1998), pp. 412-417, which is hereby incorporated by reference in its entirety. The silicide layer 202 and the layer 180 are then removed outside the cutouts 174 and 176 using CMP.

Furthermore, a metallization is applied using a BEOL method, a source contact 204 being produced in the cutout 174 and a drain contact 206 being produced in the cutout 176. In one embodiment, the source contact 204 covers only a basic area of the substrate 152, which is smaller than half the area covered by the cutout 174.

As shown, there is a nonplanar interface between metallically conductive zone and highly doped semiconductor of the epitaxial regions 84, 86 or the layer 180. Surface-enlarging measures are used in the production of the interface between metallically conductive zone 102, 202 and highly doped semiconductor 84, 86 or 180. The surface enlargement occurs in a transition layer 210 or 212 lying parallel to the substrate 52 or to the substrate 152.

In general, the transition layer 210 or 212 has a layer thickness of greater than about 10 nm. The thickness of the transition layer may be greater than about 20 nm or greater than about 30 nm. An increasing layer thickness of the transition layer is accompanied by an increase in the achievable surface enlargement of the boundary layer between connection region and semiconducting material layer. The upper limit is determined, however, e.g. by the layer thickness of the layer with the cutout.

In one embodiment, the transition layer 210 or 212 has a uniform thickness with fluctuations of less than 10 percent of the average layer thickness. This type of meshing of the metallic connection region and the semiconducting material layer enlarges the contact area for the same lateral dimensions, by more than about 50% or even by more than about 100% compared with a transition layer which only has a layer thickness of less than 1 nm, as is present in the atomic range or at the lattice level. In particular, the transition layer 210 of the circuit arrangement 58 has a thickness D1 of greater than about 15 nm, for example, greater than about 100 nm. The transition layer 212 of the circuit arrangement 148 has a smaller thickness D2 than the thickness D1 of the transition layer 210. In the embodiment shown, the thickness D2 of the transition layer 212 is about 20 nm, for example. In other embodiments, the thickness D2 of the transition layer 212 may lie between about 20 nm and 40 nm.

As indicated, the semiconductor material of the substrate may be monocrystalline silicon, a compound semiconductor, or some other semiconductor material. The electrically insulating material may be an insulating material other than silicon dioxide. Silicides may be used for the connection region as they have a higher conductivity than the semiconductor of the material layer and adhere well to the semiconductor material. The connection region may contain, for example, titanium silicide, cobalt silicide and/or nickel silicide. The silicide may be deposited by vapor phase deposition. In this case, the material of the material layer may not brake down during application of the silicide, as would be the case when converting a sputtered-on metal into silicide.

In addition, although only a few partial regions are shown in the figures, the transition layer may be penetrated by at least about ten or by at least about a hundred partial regions of the material layer which are all completely surrounded by metal in the transition layer. Similarly, a number of partial regions of the connection region may penetrate the transition layer. In one example, the cutout has an area of less than about 1 $\mu m^2$ or less than about 0.25 $\mu m^2$. In this case, a hundred penetrations on such a small area region increases the interface between the semiconducting material layer and the metallic connection region and thus decreases the ohmic resistance.

The transition layer may contain more material of the material layer (e.g. semiconductor) than material of the connection region. The volume ratio between the material of the material layer and the material of the connection region may be greater than about 60:40 or greater than about 70:30. This permits the transition layer to contain a greater material portion of the semiconductor material, which exhibits poorer electrical conductivity, than of the metallic material, which exhibits better electrical conductivity in comparison therewith. This also considerably reduces the contact resistance.

The partial regions of the connection region which penetrate the transition layer may reach the substrate. In other words, the lower boundary of the transition layer may lie, for example, less than about 5 nm or less than about 3 nm above the substrate. The material layer is thus completely or almost completely penetrated by the connection regions. This increases the surface area of the interface between connection region and the material layer.

The material layer may contain monocrystalline or polycrystalline semiconductor material. When the material layer contains monocrystalline semiconductor material, holes or trenches containing material of the connection region may be cut out in the material layer. The holes, in turn, may have cross sections lying parallel to the substrate surface with acute-angled corners for generating field spikes. The trenches may form ring structures. In one embodiment, the holes or the trenches may have a depth that is considerably larger than the smallest lateral width of a hole or trench. By way of example, the trenches may be at least about twice as deep as wide or at least about three times as deep as wide. In particular, the depth may be more than about 10 nm, more than about 20 nm or more than about 30 nm.

When the material layer contains polycrystalline semiconductor material, the holes or trenches may be introduced such that grains of the polycrystalline material are penetrated. In other words, there is no relationship between the position of the holes or trenches and the position of grain boundaries of the grains of the polycrystalline semiconductor material, such as when the trenches are produced using grain boundaries of an auxiliary layer which is removed after the production of a mask. Within a grain, monocrystalline material (i.e. a regularly constructed lattice) is present, apart from local lattice defects.

Alternatively, when the material layer contains polycrystalline semiconductor material, the position of the parts of the connection region which penetrate the transition layer may be prescribed by the position of grain boundaries of the grains of the polycrystalline semiconductor material. By way of example, the position of the parts of the connection region which penetrate the transition layer may be prescribed by the position of grain boundaries in the case of hemispherically deposited polycrystalline layers.

With, for example, hemispherically deposited grains, the material layer may contain only one layer of grains. At least about 80% of the grains may be separated by distances from other grains, so that a continuous layer is not produced. This permits the cutout to contain only a small amount of polycrystalline material, which has a lower electrical conductivity compared with the substrate or the connection region. On the other hand, the grains may not limited in distance from each other such that the distance between grains is greater than the average grain diameter. This increases the interface between connection region and semiconductor material.

The connection region may be electrically conductively connected to a connection made of metal. The cutout may taper toward the connection with increasing distance from the substrate. In one embodiment, the cutout may have a larger cross-sectional area parallel to the substrate surface than a cross-sectional area through the connection. Thus, the cross-sectional area of the cutout is more than about 50% or more than about 100% larger, for example, than the cross-sectional area of the connection. In this case, the metal-semiconductor contact may be situated not only at the bottom of the contact hole for the connection, but in a region which also extends laterally with respect to the bottom of the contact hole. The contact resistance can further be reduced. While the contact hole is produced by means of a photolithographic method, the connection region can be produced in self-aligning fashion by a selective deposition, for example.

In another embodiment, a doped connection zone of a transistor may be arranged at the bottom of the cutout in the substrate, for example a drain/source zone of a MOSFET or of an insulated gate transistor. As an alternative, a doped insulation well may be arranged at the bottom of the cutout in the substrate, the insulation well serving for insulating regions with active components from the substrate.

The material layer may be doped with a dopant concentration of greater than about $10^{18}$ atoms per $cm^3$ or greater than about $10^{20}$ atoms per $cm^3$, e.g. about $10^{21}$ doping atoms per $cm^3$. The higher the dopant concentration, the lower the electrical resistance of the material of the contact layer. In particular, doping may be effected with a magnitude such that a "degenerate" semiconductor arises, having properties of a metallic substance.

During fabrication, at least one electronic component is provided in or on the substrate. An electrically insulating insulation layer is provided after the component is provided. At least one cutout is arranged in the insulation layer and a semiconducting material layer is introduced into the cutout. The material layer is patterned using a mask and/or formed with at least semi-laterally uncovered grains after or during the introduction of the material layer. A metallic layer is provided after the patterning of the material layer or after the formation of the material layer. Parts of the metallic layer extend into the patterned material layer or between the uncovered grains.

To pattern the semiconducting material layer, a material layer made of monocrystalline or polycrystalline material is introduced into the cutout. A mask layer is applied after the introduction of the material layer and a polycrystalline layer is then applied. The polycrystalline layer is etched at grain boundaries, grain center regions. Grain boundary regions between only two adjacent grains may or may not be etched away. The grain center regions are used for the patterning of the mask layer in an etching process. The material layer is patterned using the mask layer. With regard to the use of independently forming grain boundaries, a self-assembled mask may be produced. In particular, such a method is not dependent on a specific exposure wavelength as is the case in photolithographic methods. Alternative methods for patterning the material layer below the minimum feature size that can be etched by means of a photolithographic method include, for example, irradiation of a radiation-sensitive layer with particle radiation, e.g. with an electron beam.

Alternatively, the material layer is produced by means of HSG. In this case, a polycrystalline base layer is produced. Seeds are then produced in the polycrystalline base layer. Grain growth is then produced in the polycrystalline base layer. The grains can also be produced directly from the vapor phase, that is to say, without the prior application of a base layer.

The metallic layer may be applied to the patterned material layer directly from the vapor phase by a deposition method such as CVD. In this case, a subsequent material conversion as in the case of sputtering a metal onto silicon and subsequent heat treatment to form silicide may be avoided.

Accordingly, an integrated circuit arrangement and fabrication method is presented. The integrated circuit arrangement contains, for example, a semiconductor and a metal electrode with a transition layer disposed therebetween. The contact area between a semiconductor and the electrode is increased without increasing the lateral dimensions using partial regions of the semiconductor and/or of the electrode that extend through the transition layer.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:

1. A transistor comprising:
    a semiconductor substrate;
    a connection region containing a metal, the connection region of the transistor having a plurality of partial regions being in electrical communication with each other;
    a monocrystalline semiconductor between the substrate and the connection region, the monocrystalline semiconductor of the transistor having a plurality of partial regions being in electrical communication each other; and
    an electrically insulating insulation layer containing a cutout leading to the substrate, the cutout containing the monocrystalline semiconductor, the cutout having a cross-sectional area parallel to a surface of the substrate of less than 0.25 $\mu m^2$,
    wherein:
    a transition layer parallel to a surface of the substrate between the substrate and the connection region is penetrated by at least one of the plurality of partial regions of the monocrystalline semiconductor and by the plurality of partial regions of the connection region, the transition layer has a thickness of greater than about 10 nm, the transition layer being located with a cavity defined by the cutout,
    the at least one of the plurality of partial regions of the monocrystalline semiconductor are completely surrounded by the metal in the transition layer and the at least one of the partial regions of the connection region are completely surrounded by the monocrystalline semiconductor in the transition layer, and
    trenches containing the metal are cut out in the monocrystalline semiconductor, at least one trench has a depth that is at least twice as large as a lateral dimension of the at least one trench.

2. The circuit arrangement of claim 1, wherein at least one of:
    the transition layer is penetrated at least one of by at least ten semiconductor partial regions or by at least ten connection region partial regions, or
    the transition layer contains more of the monocrystalline semiconductor than of the metal.

3. The circuit arrangement of claim 1, wherein parts of the connection region which penetrate the transition layer reach the substrate.

4. The circuit arrangement of claim 1, wherein the trenches have cross sections parallel to the surface of the substrate which contain a plurality of corners or are formed in ring shapes.

5. The circuit arrangement of claim 1, wherein at least one of:
    the connection region comprises a silicide,
    the cutout tapers with increasing distance from the substrate, or a doped connection zone of a transistor is arranged at a bottom of the cutout in the substrate, or a doped insulation well is arranged at the bottom of the cutout in the substrate.

6. A transistor comprising:
a semiconductor substrate;
a connection region containing a metal, the connection region of the transistor having a plurality of partial regions being in electrical communication with each other; and
a polycrystalline semiconductor between the substrate and the connection region, the polycrystalline semiconductor of the transistor having a plurality of partial regions being in electrical communication with each other,
an electrically insulating insulation layer containing a cutout leading to the substrate, the cutout containing the polycrystalline semiconductor, the cutout having a cross-sectional area parallel to a surface of the substrate of less than 0.25 $\mu m^2$,
wherein:
a transition layer parallel to a surface, of the substrate between the substrate and the connection region is penetrated by of the plurality of partial regions of the polycrystalline semiconductor and by the plurality of partial regions of the connection region, the transition layer has a thickness of greater than about 10 nm, the transition layer being located within a cavity defined by the cutout,
the plurality of semiconductor partial regions of the polycrystalline semiconductors are completely surrounded by the metal in the transition layer and the connection region partial regions are completely surrounded by the polycrystalline semiconductor in the transition layer,
a position of the parts of the connection region that penetrate the transition layer are prescribed by a position of grain boundaries of grains of the polycrystalline semiconductor,
the polycrystalline semiconductor contains only one layer of grains, and
wherein parts of the connection region which penetrate the transition layer reach the substrate.

7. The circuit arrangement of claim 6, wherein at least one of:
the transition layer is penetrated at least one of by at least ten semiconductor partial regions or by at least ten connection region partial regions, or
the transition layer contains more of the polycrystalline semiconductor than of the metal.

8. The circuit arrangement of claim 6, wherein at least one of:
the connection region comprises a silicide,
a doped connection zone of a transistor is arranged in the substrate below the polycrystalline semiconductor, or a doped insulation well is arranged in the substrate below the polycrystalline semiconductor.

9. The circuit arrangement of claim 6, wherein trenches containing the metal are cut out in the polycrystalline semiconductor, the trenches have cross sections parallel to the surface of the substrate which contain a plurality of corners or are formed in ring structures.

10. The circuit arrangement of claim 6, where at least 80% of the grains are separated from other grains.

11. A method for producing a transistor, the method comprising the following performed without restriction by the order specified:
providing a substrate;
forming a monocrystalline or polycrystalline semiconductor layer on the substrate, the monocrystalline or polycrystalline semiconductor layer of the transistor having a plurality of partial regions being in electrical communication with each other;
forming a mask layer after forming the monocrystalline or polycrystalline semiconductor layer;
forming a polycrystalline layer after forming the mask layer;
forming an electrically insulating insulation layer;
providing a cutout in the insulation layer,
wherein the monocrystalline or polycrystalline semiconductor layer of the transistor is formed in the cutout, wherein a transition layer parallel to a surface of the substrate is penetrated by of the plurality of partial regions of the monocrystalline or the polycrystalline semiconductor layer, the transition layer has a thickness of greater than about 10 nm, the transition layer located within a cavity defined by the cutout,
etching the polycrystalline layer at grain boundaries, and leaving grain center regions and grain boundary regions between only two adjacent grains substantially unetched;
using the grain center regions and the residual grain boundary regions for patterning the mask layer in an etching process;
patterning the monocrystalline or polycrystalline semiconductor layer using the mask layer; and
forming a metal layer after forming the monocrystalline or polycrystalline semiconductor layer such that parts of the metal layer extend into the patterned monocrystalline or polycrystalline semiconductor layer.

12. The method of claim 11, wherein the metal layer is formed on the patterned monocrystalline or polycrystalline semiconductor layer by means of a method in which a silicide is deposited from the vapor phase.

13. The method of claim 11, wherein the monocrystalline or polycrystalline semiconductor layer is patterned such that trenches are formed in the monocrystalline or polycrystalline semiconductor layer and have cross sections parallel to a surface of the substrate which contain a plurality of corners or are formed in ring shapes.

14. The method of claim 11, wherein the monocrystalline or polycrystalline semiconductor layer is patterned such that trenches are formed in the monocrystalline or polycrystalline semiconductor layer, and at least one trench has a depth that is at least twice as large as a lateral dimension of the at least one trench.

15. A method for producing a transistor, the method comprising the following performed without restriction by the order specified:
providing a substrate;
forming a semiconductor layer on the substrate, the semiconductor layer having at least semi-laterally uncovered isolated grains after or during formation of the semiconductor layer on the substrate, the semiconductor layer of the transistor having a plurality of partial regions being in electrical communication with each other; and
forming an electrically insulating insulation layer; and
providing a cutout in the insulation layer,
wherein the semiconductor layer of the transistor is formed in the cutout, wherein a transition layer parallel to a surface of the substrate is penetrated by at least one of a plurality of partial regions of the semiconductor layer, the transition layer has a thickness of greater than about 10 nm, the transition layer located within a cavity defined by the cutout, forming a metal layer after forming the semiconductor layer such that parts of the metal layer extend between the uncovered grains, and where at least 80% of the grains are separated from other grains.

16. The method of claim 15, wherein the metal layer is formed on the semiconductor layer by means of a method in which a silicide is deposited from the vapor phase.

17. The method of claim 15, further comprising forming a doped connection zone of a transistor or a doped insulation well in the substrate below the semiconductor layer.

* * * * *

UNITED STATES PATENT AND TRADEMARK OFFICE
CERTIFICATE OF CORRECTION

| | | |
|---|---|---|
| PATENT NO. | : 7,560,351 B2 | Page 1 of 1 |
| APPLICATION NO. | : 11/324803 | |
| DATED | : July 14, 2009 | |
| INVENTOR(S) | : Franz Hofmann et al. | |

It is certified that error appears in the above-identified patent and that said Letters Patent is hereby corrected as shown below:

On the Title Page

Item (73), insert --München-- before (DE).

Signed and Sealed this
Twenty-fifth Day of January, 2011

David J. Kappos
*Director of the United States Patent and Trademark Office*